US011088309B2

United States Patent
Saitou et al.

(10) Patent No.: US 11,088,309 B2
(45) Date of Patent: Aug. 10, 2021

(54) THERMOELECTRIC CONVERSION ELEMENT AND THERMOELECTRIC CONVERSION MODULE

(71) Applicant: Panasonic Intellectual Property Management Co., Ltd., Osaka (JP)

(72) Inventors: Yui Saitou, Kyoto (JP); Yoshihiro Nakamura, Osaka (JP); Satoshi Maeshima, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 2 days.

(21) Appl. No.: 16/138,879

(22) Filed: Sep. 21, 2018

(65) Prior Publication Data

US 2019/0027671 A1    Jan. 24, 2019

Related U.S. Application Data (63) Continuation of application No. PCT/JP2017/012237, filed on Mar. 27, 2017.

(Continued)

(51) Int. Cl.
*H01L 35/32* (2006.01)
*H01L 35/08* (2006.01)
(Continued)

(52) U.S. Cl.
CPC .............. *H01L 35/32* (2013.01); *H01L 35/08* (2013.01); *H01L 35/16* (2013.01); *H01L 35/34* (2013.01);
(Continued)

(58) Field of Classification Search
CPC ......... H01L 35/32; H01L 35/34; H01L 35/08; H01L 35/16; H01L 35/04; H01L 35/18; H01L 35/20; H01L 35/28; H01L 35/06; H01L 35/10; H01L 2924/0002; H01L 21/67103; H01L 2924/00; Y10S 977/773; B82Y 40/00; H05K 2201/10219;
(Continued)

(56) References Cited

U.S. PATENT DOCUMENTS

| | | | | |
|---|---|---|---|---|
| 6,347,521 B1* | 2/2002 | Kadotani | ................ | F25B 21/02 136/204 |
| 2005/0016183 A1* | 1/2005 | Tateyama | ............ | H05K 1/0204 62/3.7 |

(Continued)

FOREIGN PATENT DOCUMENTS

| | | |
|---|---|---|
| JP | 5235038 B2 | 7/2013 |
| WO | 2009/142240 A1 | 11/2009 |
| WO | 2011/118341 A1 | 9/2011 |

OTHER PUBLICATIONS

Gritco "Moh's scale of relative hardness" http://www.armtech.pl/f/uslugi/Mohs_scale_of_relative_hardness.pdf.*
(Continued)

*Primary Examiner* — Michael Y Sun
(74) *Attorney, Agent, or Firm* — McDermott Will & Emery LLP (57) ABSTRACT

A thermoelectric conversion element includes a thermoelectric member that is columnar and an insulator formed around the thermoelectric member. Particles are enclosed between the thermoelectric member and the insulator.

20 Claims, 7 Drawing Sheets

Related U.S. Application Data (60) Provisional application No. 62/314,221, filed on Mar. 28, 2016.

(51) Int. Cl.
| | | |
|---|---|---|
| *H01L 35/16* | (2006.01) | |
| *H01L 35/34* | (2006.01) | |
| *H01L 21/67* | (2006.01) | |
| *F25B 21/02* | (2006.01) | |
| *H05K 1/02* | (2006.01) | |
| *H01L 35/06* | (2006.01) | |
| *H01L 35/10* | (2006.01) | |
| *B82Y 40/00* | (2011.01) | |
| *H01L 35/28* | (2006.01) | |
| *H01L 35/04* | (2006.01) | |
| *H01L 35/18* | (2006.01) | |
| *H01L 35/20* | (2006.01) | |

(52) U.S. Cl.
CPC ............... *B82Y 40/00* (2013.01); *F25B 21/02* (2013.01); *F25B 2500/01* (2013.01); *H01L 21/67103* (2013.01); *H01L 35/04* (2013.01); *H01L 35/06* (2013.01); *H01L 35/10* (2013.01); *H01L 35/18* (2013.01); *H01L 35/20* (2013.01); *H01L 35/28* (2013.01); *H01L 2924/00* (2013.01); *H01L 2924/0002* (2013.01); *H05K 1/0204* (2013.01); *H05K 2201/10219* (2013.01); *Y10S 977/773* (2013.01); *Y10T 29/49002* (2015.01); *Y10T 29/4913* (2015.01); *Y10T 29/49144* (2015.01)

(58) Field of Classification Search
CPC ............ H05K 1/0204; Y10T 29/49144; Y10T 29/49002; Y10T 29/4913; F25B 21/02; F25B 2500/01
See application file for complete search history.

(56) References Cited

U.S. PATENT DOCUMENTS

| | | | | |
|---|---|---|---|---|
| 2006/0042676 | A1* | 3/2006 | Sogou | H01L 35/06 136/212 |
| 2006/0118158 | A1* | 6/2006 | Zhang | H01L 35/16 136/205 |
| 2008/0023058 | A1* | 1/2008 | Ito | H01L 35/34 136/201 |
| 2010/0108117 | A1* | 5/2010 | Hamano | H01L 35/32 136/241 |
| 2011/0061704 | A1 | 3/2011 | Nakamura et al. | |
| 2011/0088737 | A1* | 4/2011 | Nakamura | H01L 35/32 136/200 |
| 2011/0265863 | A1* | 11/2011 | Nagashima | C03C 3/087 136/252 |
| 2012/0263207 | A1 | 10/2012 | Higashida et al. | |
| 2013/0014796 | A1* | 1/2013 | Tajima | H01L 35/08 136/203 |
| 2013/0192654 | A1* | 8/2013 | Shin | H01L 35/26 136/203 |
| 2015/0221845 | A1* | 8/2015 | Takubo | H01L 35/14 136/238 |
| 2015/0325725 | A1* | 11/2015 | Muguruma | C03C 3/087 136/252 |
| 2018/0114872 | A1* | 4/2018 | Booth | C03C 3/122 |

OTHER PUBLICATIONS

USP "https://www.us-products.com/v/vspfiles/templates/192/documents/cubicboronnitride.pdf".*
International Search Report and Written Opinion issued in International Application No. PCT/JP2017/012237 dated Jun. 6, 2017.

* cited by examiner

THERMOELECTRIC CONVERSION ELEMENT AND THERMOELECTRIC CONVERSION MODULE

CROSS REFERENCE TO RELATED APPLICATIONS

This application is a United States continuation application of PCT International Patent Application Number PCT/JP2017/012237 filed on Mar. 27, 2017, claiming the benefit of priority of U.S. Provisional Application No. 62/314,221 filed on Mar. 28, 2016, the entire contents of which are hereby incorporated by reference.

BACKGROUND

1. Technical Field

The present disclosure relates to a thermoelectric conversion element and a thermoelectric conversion module.

2. Description of the Related Art

A thermoelectric conversion module uses a thermoelectric conversion element that utilizes the Seebeck effect or the Peltier effect. Since the thermoelectric conversion element is simple in structure, easy to handle, and capable of maintaining its stable properties, the use of the thermoelectric conversion element over a wide range has gained attention in recent years. This includes in particular the use for exhaust heat recovery at refuse disposal facilities and cooling of laser diodes.

Figure 6:
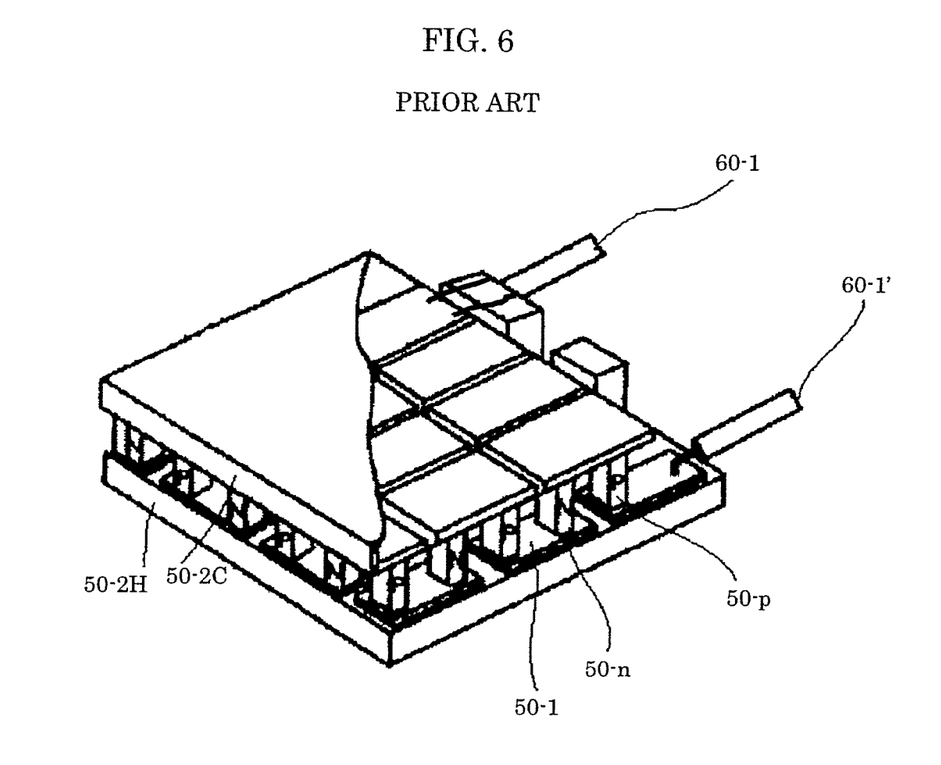
FIG. 6 is a perspective view of a conventional thermoelectric conversion module.

Note that International Publication WO2011/118341 discloses a thermoelectric conversion module used for cooling purposes by utilizing the Peltier effect described above. As illustrated in FIG. 6, the thermoelectric conversion module disclosed in International Publication WO2011/118341 has a configuration in which a plurality of pairs of pn elements are arranged in series by joining p-type thermoelectric conversion elements 50-$p$ having the p-type properties and n-type thermoelectric conversion elements 50-$n$ having the n-type properties via contact electrodes 50-1 and solder, for example. Extraction terminals 60-1 and 60-1' are connected to contact electrodes 50-1 located at both ends of the series arrangement. Further, contact electrodes 50-1 are sandwiched from the outside between high-temperature-side ceramic substrate 50-2H and low-temperature-side ceramic substrate 50-2C which make up a pair of wiring substrates.

At this time, by supplying a current from extraction terminals 60-1 and 60-1', it is possible to, for example, increase the temperature of high-temperature-side ceramic substrate 50-2H and decrease the temperature of low-temperature-side ceramic substrate 50-2C. In other words, it is possible to provide a temperature difference. By bringing low-temperature-side ceramic substrate 50-2C into contact with a target object to be cooled, the thermoelectric conversion module cools down the target object.

Used as the material of p-type thermoelectric conversion elements 50-$p$ and n-type thermoelectric conversion elements 50-$n$ is a material having a large figure of merit Z ($=\alpha^2/\rho K$) represented by Seebeck coefficient $\alpha$, resistivity $\rho$, and thermal conductivity K which are constants peculiar to the substance in the use temperature range. In particular, in the thermoelectric conversion module utilizing the Peltier effect, a bismuth telluride (BiTe)-based material is generally used as a thermoelectric member.

Figure 7:
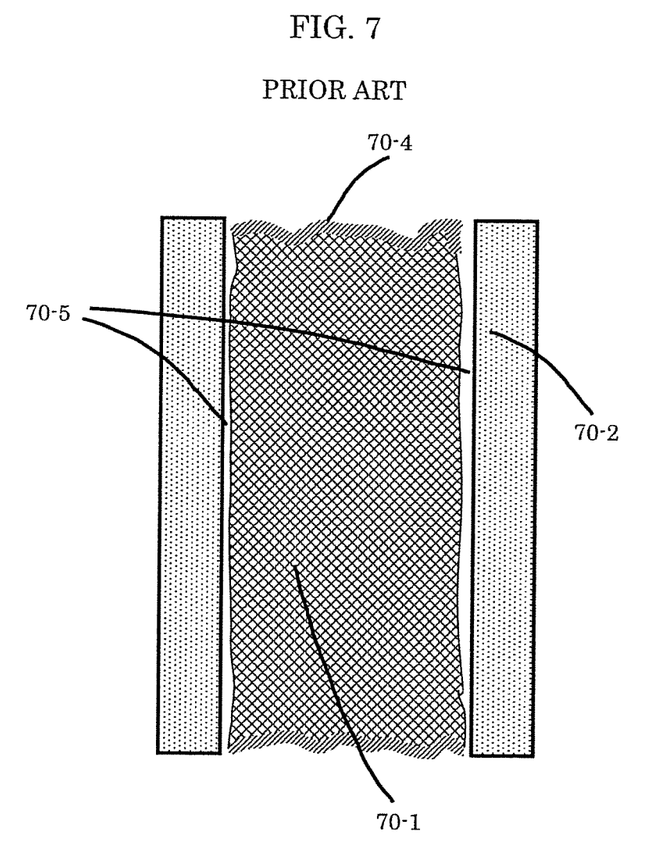
FIG. 7 is a cross-sectional view of a conventional thermoelectric conversion element.

Note that since the BiTe-based material is a brittle material, it is a known technique to form insulator 70-2 made of an insulating material such as glass around thermoelectric member 70-1 as illustrated in FIG. 7 so as to increase the mechanical strength (see International Publication WO2009/142240).

SUMMARY

However, at the interface between thermoelectric member 70-1 made of the BiTe-based material and insulator 70-2, no alloy or compound is formed directly, and there is always gap 70-5 formed. Furthermore, when electrode 70-4 is to be formed on the BiTe-based material, an etching step is performed for chemically roughening the surface of the BiTe-based material in advance, which further enlarges gap 70-5. Gap 70-5 has, depending on the location, many spots where the gap passes through in the up-down direction, and when electrode 70-4 is formed by a plating method, the plating solution enters gap 70-5 and as a result causes a short circuit in electrode 70-4 in the up-down direction, thereby significantly deteriorating the thermoelectric performance as compared to the thermoelectric performance intended.

The present disclosure has been conceived to solve the above problem and has an object to provide a high-performance thermoelectric conversion element and thermoelectric conversion module having less deterioration in performance.

A thermoelectric conversion element according to an aspect of the present disclosure includes: a thermoelectric member that is columnar; and an insulator formed around the thermoelectric member. Particles are enclosed between the thermoelectric member and the insulator.

The thermoelectric conversion element may further include a metal layer formed continuously on an edge surface of the thermoelectric member and an edge surface of the insulator.

The Mohs hardness of the particles may be greater than the Mohs hardness of the insulator.

The material of the particles may include one of silicon carbide, diamond, alumina, silica, and titanium oxide, or two or more of silicon carbide, diamond, alumina, silica, and titanium oxide.

The particles may have a surface on which water repellent treatment is performed.

The diameters of the particles may be smaller than the thickness of the insulator.

The diameters of the particles may be at least 1 μm.

The material of the insulator may be a glass material or quartz glass.

The material of the insulator may be the glass material, and the composition of the insulator may include 3% to 5% by weight of $B_2O_3$, 10% to 15% by weight of $Al_2O_3$, 5% to 10% by weight of BaO, 8% to 13% by weight of CaO, 1% to 5% by weight of MgO, $SiO_2$, and an alkali metal.

Further, a thermoelectric conversion module according to an aspect of the present disclosure includes: a first wiring substrate; a second wiring substrate opposed to the first wiring substrate; and a plurality of thermoelectric conversion elements arrayed between the first wiring substrate and the second wiring substrate, the plurality of thermoelectric conversion elements each being any of the thermoelectric conversion elements described above.

According to the present disclosure, it is possible to provide a high-performance thermoelectric conversion element and thermoelectric conversion module having less deterioration in performance.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF EMBODIMENT

Hereinafter, an embodiment of the present disclosure is described with reference to the drawings.

Figure 1:
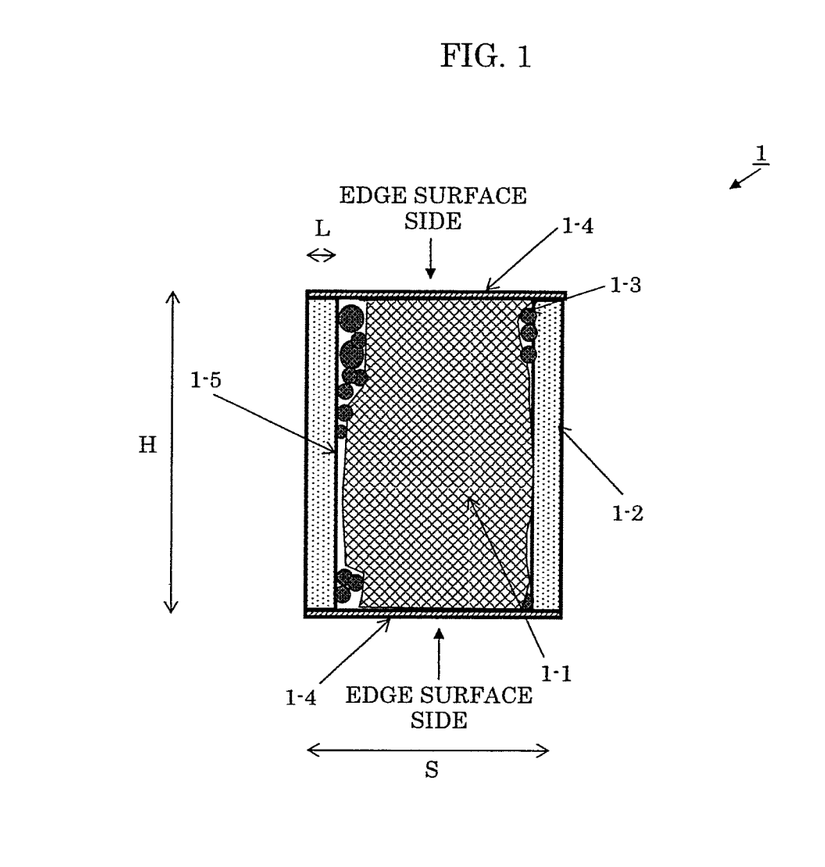
FIG. 1 is a cross-sectional view of a thermoelectric conversion element according to an embodiment.

FIG. 1 is a cross-sectional view of thermoelectric conversion element 1 according to the present embodiment. Thermoelectric conversion element 1 includes thermoelectric member 1-1 that is columnar, insulator 1-2 formed around thermoelectric member 1-1, gap 1-5 formed at the interface between thermoelectric member 1-1 and insulator 1-2, and particles 1-3 enclosed in gap 1-5.

Thermoelectric member 1-1 is a columnar member having thermoelectric conversion properties, that is, thermoelectric member 1-1 is capable of: generating a temperature difference between the edge surfaces of thermoelectric conversion element 1 when a current passes through thermoelectric member 1-1; and passing a current through thermoelectric member 1-1 when a temperature difference is generated at the edge surfaces of thermoelectric conversion element 1. There are a p-type thermoelectric member and an n-type thermoelectric member as thermoelectric member 1-1.

The present embodiment describes an example in which a BiTe-based material is used as both the p-type and n-type thermoelectric members. Specifically, the BiTe-based material used as the p-type thermoelectric member is Sb-doped $Bi_{0.5}Sb_{1.5}Te_3$, and the BiTe-based material used as the n-type thermoelectric member is Se-doped $Bi_2Te_{2.7}Se_{0.3}$.

Note that, in the present embodiment, although these BiTe-based materials may be used as thermoelectric member 1-1, materials are not particularly limited, and materials such as a CoSb-based material, a PdTe-based material, or a MnSi-based material are also applicable, as long as such materials have the thermoelectric conversion properties.

In addition, in some cases, the material of thermoelectric member 1-1 may be: a material obtained by adding various elements to, or partially adjusting the element ratios of, the general composition of the BiTe-based material so as to further improve the thermoelectric properties; or a BiTe-based material containing a binder such as carbon nanotube, fullerene, or glass frit so as to strengthen the material.

Figure 2:
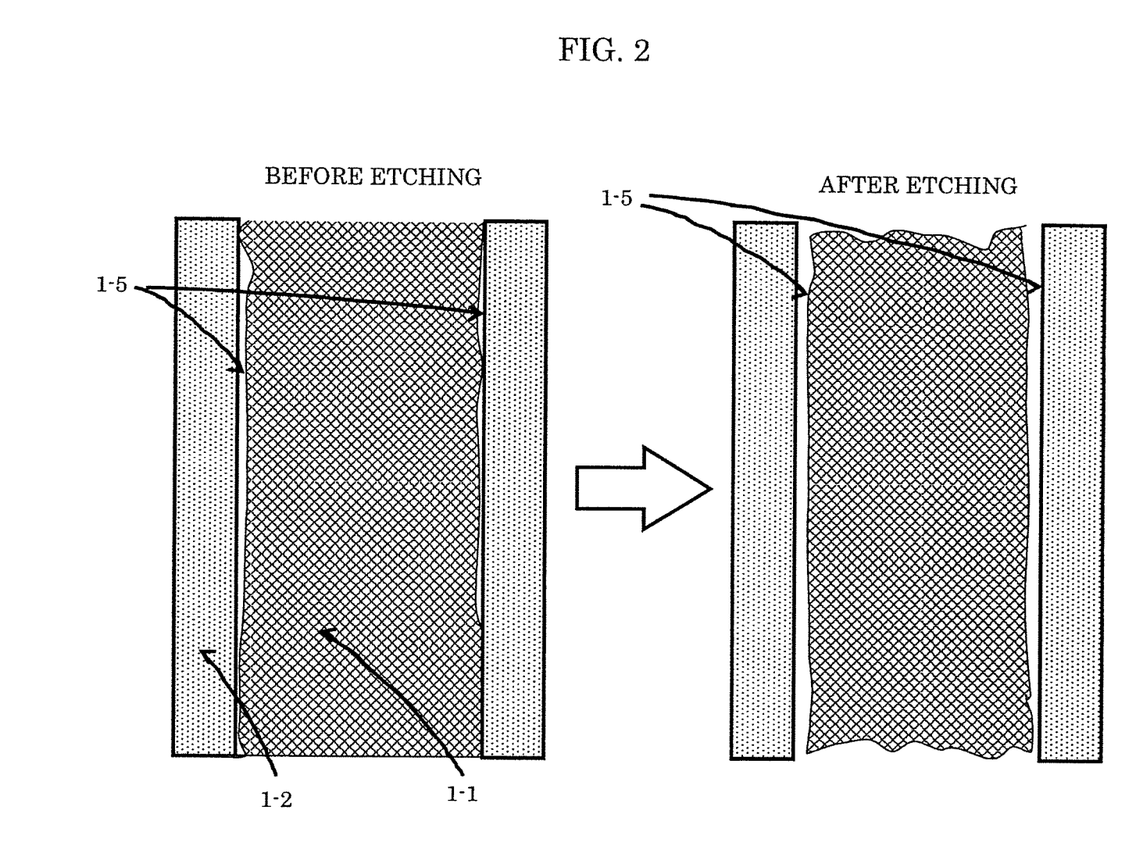
FIG. 2 is a cross-sectional view illustrating a change in shape of the thermoelectric conversion element according to the embodiment before and after etching.

Before forming metal layer 1-4 on the edge surface side of thermoelectric member 1-1, as illustrated in FIG. 2, the edge surface of thermoelectric member 1-1 is etched using an etchant capable of dissolving thermoelectric member 1-1, such as sulfuric acid, nitric acid, hydrogen peroxide solution, or ammonium fluoride. As a result, the edge surface of thermoelectric member 1-1 is made rough. With this, the surface area of the edge surface of thermoelectric member 1-1 is increased, thereby generating an anchor effect when metal layer 1-4 is formed, and stronger adhesion can be thus achieved.

Note that the type of liquid used as the etchant is not particularly limited as long as it is capable of etching thermoelectric member 1-1.

With the above etching process, gap 1-5 which has been initially formed at the interface between thermoelectric member 1-1 and insulator 1-2 is further enlarged. Note that thermoelectric member 1-1 and insulator 1-2 are partially in contact with each other, and the frictional force thereof allows thermoelectric member 1-1 to be held by insulator 1-2 and prevents thermoelectric member 1-1 from coming off from insulator 1-2.

Further, the shape of thermoelectric conversion element 1 is not particularly limited to a prism or a cylinder, for example, but in consideration of the effect of alleviating stress concentration etc., thermoelectric conversion element 1 may have a cylindrical shape.

In addition, the material of insulator 1-2 is not particularly limited to an inorganic material such as ceramics and glass, or a polymeric material typified by epoxy, as long as it is an insulator material. However, from the viewpoint of strength and reliability, quartz glass, heat-resistant glass (a material that is a type of borosilicate glass in which $SiO_2$ and $B_2O_3$ are mixed and that has an expansion coefficient of about $3 \times 10^{-6}/K$), PYREX manufactured by Corning (registered trademark), etc. may be used.

Further, as the material of insulator 1-2, glass including 3% to 5% of $B_2O_3$, 10% to 15% of $Al_2O_3$, 5% to 10% of BaO, 8% to 13% of CaO, 1% to 5% of MgO, $SiO_2$, and an alkali metal may be used, because use of this glass decreases heat conduction and increases the softening point.

Furthermore, although thickness L of insulator 1-2 is not particularly limited, insulator 1-2 may be as thin as possible because the presence of insulator 1-2 in thermoelectric conversion element 1 or the thermoelectric conversion module adversely affects the properties. The properties are markedly deteriorated especially when thickness L of insulator 1-2 is 10 mm or greater. Meanwhile, since a sufficient mechanical strength is required, thickness L of insulator 1-2 is desirably in a range of 0.01 mm to 10 mm. Thickness L of insulator 1-2 is more desirably in a range of 0.015 mm to 3 mm because the performance deterioration caused by the insulator is almost negligible when thickness L is 3 mm or less.

In addition, width S and height H of tubular thermoelectric conversion element 1 are designed according to the electrical performance and the restrictions on the size in use of each module, and are therefore not particularly limited. However, width S is desirably in a range of 0.1 mm to 10 mm. When width S is less than 0.1 mm, the cross-sectional area of thermoelectric member 1-1 decreases, causing the resistance to be excessive, whereas when width S is greater than 10 mm, it becomes difficult to uniformly form thermoelectric member 1-1 inside.

Height H is desirably in a range of 0.1 mm to 10 mm. When the module is formed with height H less than 0.1 mm, the distance between the upper and lower surfaces is short, making it difficult to create a temperature difference, thereby causing significant reduction in the Peltier performance etc. On the other hand, with height H greater than 10 mm, application of an external force such as an impact at the time of modularization brings about a larger force, which may cause a breakdown etc. of thermoelectric conversion element 1.

Particles 1-3 are enclosed in gap 1-5. Although the method for enclosing particles 1-3 is not particularly limited, a typical technique is to place, in a liquid obtained by dispersing particles 1-3 in pure water, etched thermoelectric conversion element 1 on which metal layer 1-4 is not formed yet, and apply ultrasonic waves to the liquid. With this, sufficiently dispersed particles 1-3 enter gap 1-5 due to a capillary phenomenon. Thereafter, the liquid is dried at a temperature of about 100° C. at which the pure water evaporates, so that the pure water is vaporized and particles 1-3 are enclosed in gap 1-5.

Note that the example in which pure water is used as the solvent has been described because dispersion of particles 1-3 easily advances with a polar solvent. However, a solvent other than water can be used with no problem as long as the solvent can sufficiently disperse particles 1-3 and be dried afterward. The type of solvent is thus not particularly limited. Furthermore, the solvent may contain a dispersion material for dispersing particles 1-3.

With regard to ultrasonic waves, since the BiTe-based material is a brittle material, a frequency of 100 kHz or higher, which places a smaller load on the material, may be used.

The drying temperature may be set at or below the melting point of the BiTe-based material. Generally, it is often the case that a part of the material of the BiTe-based material is not completely alloyed and is segregated, and thus, the solvent may be dried at or below the melting point of the incorporated simple metal. This is because there is a concern that drying the solvent at a temperature higher than the melting point of the segregated metal may cause, for example, a change in the melting shape.

The hardness of particles 1-3 may be greater than that of insulator 1-2 in Mohs hardness. Note that Mohs hardness is an empirical measure for determining the hardness of a material by comparing with ten types of reference materials. When particles 1-3 softer than insulator 1-2 are used, collision etc. of particles 1-3 with insulator 1-2 at the time of enclosing particles 1-3 causes particles 1-3 to crush, and crushed particles 1-3 remain on the edge surface of thermoelectric member 1-1 as a residue. When this residue remains, sufficient adhesion cannot be achieved in the formation of metal layer 1-4.

The material of particles 1-3 may have insulation properties and high hardness. From this viewpoint, the material of particles 1-3 may be, for example, silicon carbide, diamond, alumina, silica, or titanium oxide. Alternatively, the material of particles 1-3 may be a mixture of two or more of these materials. A material other than the above-mentioned materials may be used as long as it has insulation properties and high hardness.

The sizes (particle diameters) of particles 1-3 may be smaller than thickness L of insulator 1-2. Particle diameters of particles 1-3 larger than thickness L are not preferable because when the particle diameters of particles 1-3 are larger than thickness L, collision etc. of particles 1-3 with insulator 1-2 at the time of enclosing particles 1-3 causes fracture and cracking in insulator 1-2.

Further, the sizes (particle diameters) of particles 1-3 may be larger than 1 μm. If the particle diameters of particles 1-3 are smaller than 1 μm, particles 1-3 enter between the irregularities of the etched edge surface of thermoelectric member 1-1, and it becomes difficult to remove particles 1-3 even if ultrasonic waves etc. are applied thereafter. As a result, particles 1-3 remain as a residue, and sufficient adhesion cannot be achieved in the later formation of metal layer 1-4.

Water repellent treatment may be performed on the surface of particles 1-3. Generally, a plating method is used for forming metal layer 1-4, but at that time, particles 1-3 can prevent the entry of the plating solution as described above. Here, an aqueous solvent is usually used as the plating solution, and thus, water repellent treatment on the surface of particles 1-3 can further prevent the entry of the plating solution.

Note that examples of the method for the water repellent treatment include: a method of passing particles 1-3 through weak hydrofluoric acid to subject the surface to fluorine modification; a method of modifying the surface with a silanol group using a silane coupling agent; and a method of irradiating the surface of particles 1-3 with laser light. The method of making the surface of particles 1-3 water-repellent, however, is not limited in particular.

Figure 3:
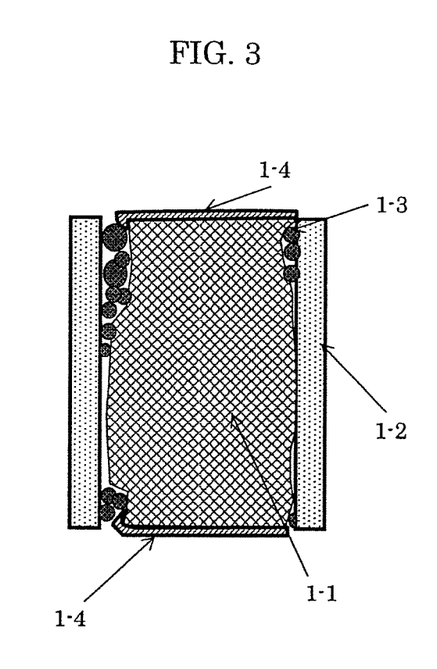
FIG. 3 is a cross-sectional view of a thermoelectric conversion element formed using an electrolytic plating process according to the embodiment.
Figure 4:
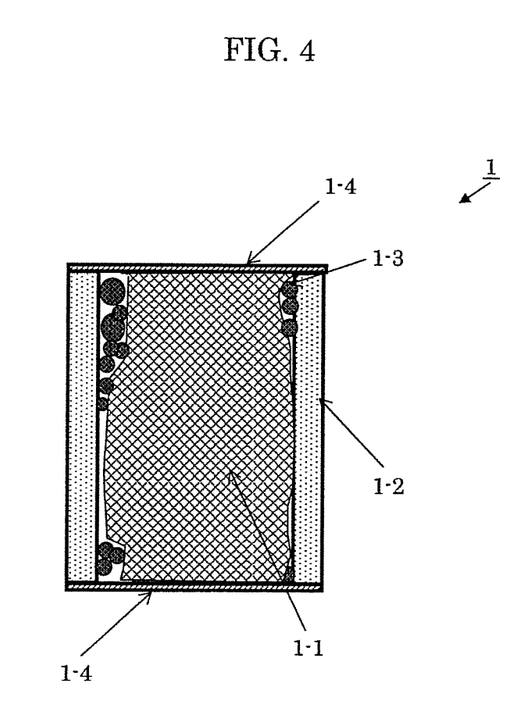
FIG. 4 is a cross-sectional view of the thermoelectric conversion element according to the embodiment, on which plate processing has performed after a seed layer is formed using a dry process.

Although the method of forming metal layer 1-4 is not particularly limited, it may be formed using a plating method. Here, metal layer 1-4 can be formed by both electrolytic plating and electroless plating. Of these two, electroless plating is more advantageous because it can be used in combination with a dry process such as sputtering and the degree of freedom in the shape of metal layer 1-4 is high. Further, metal layer 1-4 may be formed using a dry process such as a sputtering method, a vapor deposition method, or a thermal spraying method. Another possible method is to form a seed by a plating method using a dry process such as a sputtering method, a vapor deposition method, or a thermal spraying method, and then grow metal layer 1-4 by electroless plating using the seed as the base. In the case of ordinary electrolytic plating, plating grows only on the surface of thermoelectric member 1-1 as illustrated in FIG. 3. In contrast, when a seed is formed by a dry process such as a sputtering method or a vapor deposition method, the seed can be formed even on insulator 1-2. As such, when metal layer 1-4 is formed from the seed by the electroless plating method thereafter, it is possible to cover from the edge surface of thermoelectric member 1-1 to the edge surface of insulator 1-2 with metal layer 1-4 as illustrated in FIG. 4. With this, when forming metal layer 1-4 including a plurality of layers, it is possible to further prevent entry of the plating solution etc. into the gap thereafter.

Note that the material of metal layer 1-4 is not particularly limited in terms of the type of the element, so long as it has a function as a barrier film to prevent reaction between the BiTe-based material and a solder material used in modularization performed afterward and has no problem in bonding with the solder material. The material of metal layer 1-4 may be a single metal or an alloy. Further, metal layer 1-4 may include a plurality of layers.

Furthermore, metal layer 1-4 may be a metal film containing, as a main component, Ni having excellent barrier properties.

Further, when the seed is to be formed by a dry process, titanium (Ti), titanium nitride (TiN), cobalt (Co), etc. may be formed between the seed and thermoelectric member 1-1 as an adhesion layer.

In addition, a plating film including gold (Au), silver (Ag), tin (Sn), etc. necessary for subsequent joining may be formed on the Ni layer.

The thickness of metal layer 1-4 is not particularly limited because the required thickness varies depending on the type of solder used in the subsequent modularization. However, in general, when using SnAgCu solder or AuSn solder, it is said that the thickness of metal layer 1-4 is preferably in a range of 1 μm to 20 μm. When the thickness of metal layer 1-4 is less than 1 μm, there is a concern that at the time of bonding the thermoelectric conversion element to an electrode, thermal diffusion occurs due to the heat of the solder, resulting in a loss of metal layer 1-4. Moreover, when the thickness of metal layer 1-4 is greater than 20 μm, there is a concern that the internal stress of metal layer 1-4 increases and causes metal layer 1-4 to peel off.

With the above configuration, it is possible to realize high-performance thermoelectric conversion element 1 having less deterioration in performance.

Figure 5:
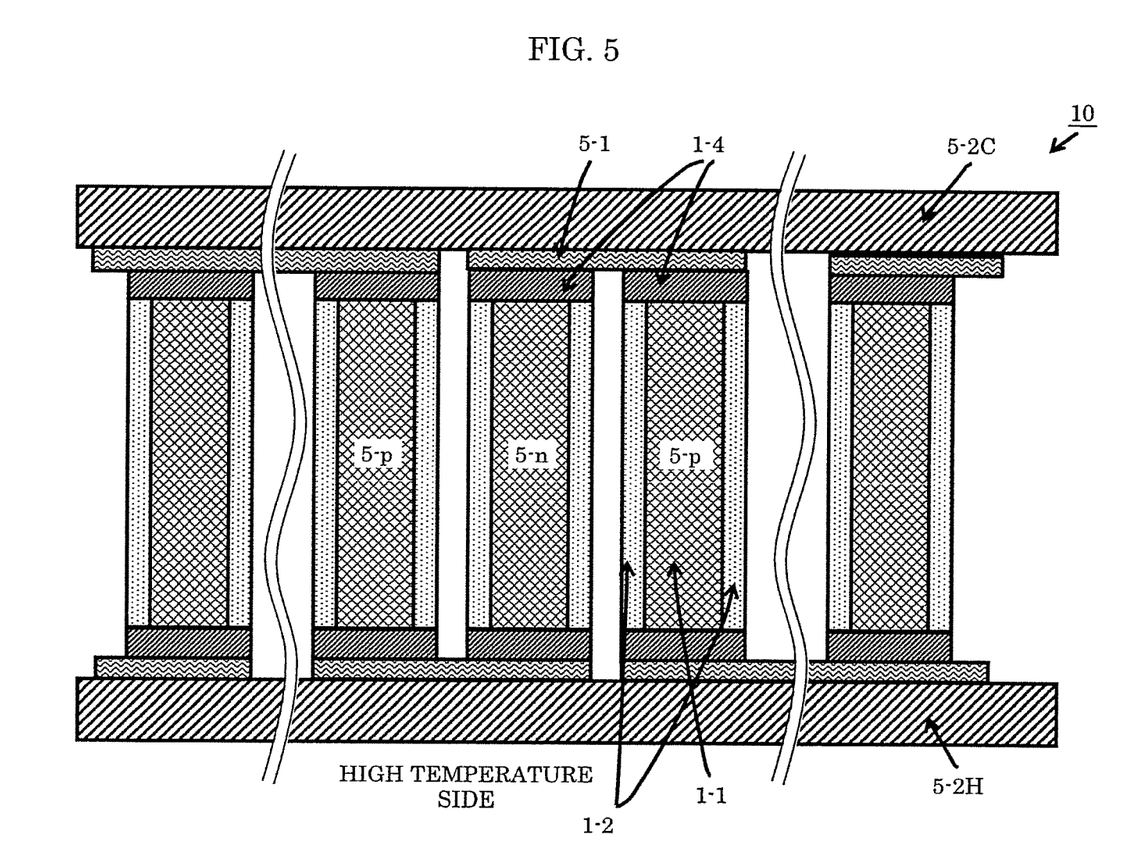
FIG. 5 is a cross-sectional view of a thermoelectric conversion module according to the embodiment.

Next, FIG. 5 illustrates an example of thermoelectric conversion module 10 according to the present embodiment using thermoelectric conversion element 1 having the above configuration. Note that thermoelectric conversion module 10 illustrated in FIG. 5 has a n-shaped structure in which p-type thermoelectric conversion elements 5-p and n-type thermoelectric conversion elements 5-n each having the structure of thermoelectric conversion element 1 enclosing particles 1-3 according to the present embodiment are arrayed in series. Here, the n-shaped structure is a structure adopted in the most common thermoelectric conversion module, and is a structure in which a substrate is disposed on both the upper side and the lower side and p-type thermoelectric conversion elements 5-p and n-type thermoelectric conversion elements 5-n are alternately connected via bonding electrodes 5-1 in the n shape.

Note that in the present embodiment, the thermoelectric conversion module having the n-shaped structure is described, but the thermoelectric conversion module is not limited to the n-shaped structure, and other structures such as a half-skeleton structure and a skeleton structure are also possible, as long as the structure is determined according to various uses.

These p-type and n-type thermoelectric conversion elements are each connected to contact electrode 5-1 using a bonding material such as gold-tin (AuSn) solder or tin-silver-copper (SnAgCu) solder. Note that the bonding material depends on the usage environment of thermoelectric conversion module 10 and the manufacturing process of the set product to which thermoelectric conversion module 10 is to be applied thereafter. The material is not particularly limited as long as it enables satisfactory electrical connection.

Further, contact electrodes 5-1 are formed on low-temperature-side ceramic substrate 5-2C and high-temperature-side ceramic substrate 5-2H each of which is a wiring substrate, and are part to which copper (Cu), aluminum (Al), etc. is wired using a plating method or a vapor deposition method. Cu is common for contact electrodes 5-1 as well, but the material is not particularly limited.

Furthermore, alumina and silicon nitride are commonly used for low-temperature-side ceramic substrate 5-2C and high-temperature-side ceramic substrate 5-2H, but the material is not limited. In particular, the material is not limited to ceramics, and metal substrates such as Cu substrates or substrates having an organic substance as the main component such as epoxy substrates can be also used in the usage environment.

With these configurations, it is possible to realize thermoelectric conversion module 10 having less deterioration in performance.

Although only one exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The present disclosure can be widely applied in various technical fields when cooling is required.

What is claimed is:

1. A thermoelectric conversion element, comprising:
   a plurality of thermoelectric members, each of which has a columnar shape that has a top surface, a bottom surface and a side surface disposed between the top surface and the bottom surface; and
   a plurality of insulators, wherein:
   each of the plurality of insulators is formed around the side surface of a corresponding one of the plurality of thermoelectric members, and at least a part of each of the plurality of insulators is in direct contact with the side surface of a corresponding one of the plurality of thermoelectric members, and
   particles are enclosed between the side surface of each of the plurality of thermoelectric members and each of the plurality of insulators, respectively.

2. The thermoelectric conversion element according to claim 1, further comprising:
   a metal layer formed continuously on one of the top surface and the bottom surface of each of the plurality of thermoelectric members and an edge surface of each of the plurality of insulators.

3. The thermoelectric conversion element according to claim 1, wherein
   a Mohs hardness of the particles is greater than a Mohs hardness of the plurality of insulators.

4. The thermoelectric conversion element according to claim 1, wherein
   a material of the particles includes one of silicon carbide, diamond; alumina, silica, and titanium oxide.

5. The thermoelectric conversion element according to claim 4, wherein
   the particles have a surface on which water repellent treatment is performed.

6. The thermoelectric conversion element according to claim 1, wherein
   diameters of the particles are smaller than a thickness of the plurality of insulators.

7. The thermoelectric conversion element according to claim 1, wherein
   diameters of the particles are at least 1 μm.

8. The thermoelectric conversion element according to claim 1, wherein
   a material of the plurality of insulators is a glass material or quartz glass.

9. The thermoelectric conversion element according to claim 8, wherein
   the material of the plurality of insulators is the glass material, and
   a composition of plurality of insulators includes 3% to 5% by weight of $B_2O_3$, 10% to 15% by weight of $Al_2O_3$, 5% to 10% by weight of BaO, 8% to 13% by weight of CaO, 1% to 5% by weight of MgO, $SiO_2$, and an alkali metal.

10. A thermoelectric conversion module, comprising:
a first wiring substrate;
a second wiring substrate opposed to the first wiring substrate; and
a plurality of thermoelectric conversion elements arrayed between the first wiring substrate and the second wiring substrate,
the plurality of thermoelectric conversion elements comprising:
   a plurality of thermoelectric members, each of which has a columnar shape that has a top surface, a bottom surface and a side surface disposed between the top surface and the bottom surface; and
   a plurality of insulators, wherein:
each of the plurality of insulators is formed around the side surface of a corresponding one of the plurality of thermoelectric members, and at least a part of each of the plurality of insulators is in direct contact with the side surface of a corresponding one of the plurality of thermoelectric members, and
particles are enclosed between the side surface of each of the plurality of thermoelectric members and each of the plurality of insulators, respectively.

11. The thermoelectric conversion element according to claim 1, further comprising a gap disposed between the side surface of each of the plurality of thermoelectric members and each of the plurality of insulators, respectively.

12. The thermoelectric conversion element according to claim 11, wherein the particles partially fill the gap.

13. The thermoelectric conversion element according to claim 11, wherein a part of the side surface of each of the plurality of thermoelectric members is not in contact with each of the plurality of insulators, respectively.

14. The thermoelectric conversion element according to claim 1, wherein at least one of the particles is in contact with the side surface of each of the plurality of thermoelectric members and each of the plurality of insulators, respectively.

15. The thermoelectric conversion element according to claim 1, wherein the particles are not disposed inside each of the plurality of thermoelectric members.

16. The thermoelectric conversion element according to claim 1, wherein
   a material of the particles includes two or more of silicon carbide, diamond, alumina, silica, and titanium oxide.

17. The thermoelectric conversion module according to claim 10, further comprising a gap disposed between the side surface of each of the plurality of thermoelectric members and each of the plurality of insulators, respectively.

18. The thermoelectric conversion module according to claim 17, wherein the particles partially fill the gap.

19. The thermoelectric conversion module according to claim 10, wherein at least one of the particles is in contact with the side surface of each of the plurality of thermoelectric members and each of the plurality of insulators, respectively.

20. The thermoelectric conversion module according to claim 10, wherein the particles are not disposed inside the thermoelectric member.

* * * * *